United States Patent [19]

Lorteije

[11] 3,858,120

[45] Dec. 31, 1974

[54] INTEGRATED SEMICONDUCTOR DEVICE OR ELEMENT

[75] Inventor: Jean Hubertus Josef Lorteije, Emmasingel, Eindhoven, Netherlands

[73] Assignee: U.S. Philips Corporation, New York, N.Y.

[22] Filed: Dec. 1, 1972

[21] Appl. No.: 311,419

Related U.S. Application Data

[63] Continuation of Ser. Nos. 147,312, April 22, 1971, abandoned, and Ser. No. 834,956, June 20, 1969, abandoned.

[30] Foreign Application Priority Data

June 29, 1968 Netherlands ....................... 6809256

[52] U.S. Cl. .................... 330/23, 330/35, 330/38 M

[51] Int. Cl. ............................................. H03f 1/32

[58] Field of Search ....... 307/310; 330/23, 35, 38 M

[56] References Cited

UNITED STATES PATENTS

| | | | |
|---|---|---|---|
| 3,393,328 | 7/1968 | Meadows et al. | 330/38 M X |
| 3,393,870 | 7/1968 | Jeffrey | 330/23 X |

*Primary Examiner*—H. K. Saalbach
*Assistant Examiner*—Lawrence J. Dahl
*Attorney, Agent, or Firm*—Frank R. Trifari

[57] ABSTRACT

In order to maintain the source voltage constant in an operating MOST amplifier that tends to drift in a thermally static environment a differential amplifier is connected to the source terminal of an identical auxiliary MOST amplifier operating under the same initial bias conditions as the operating MOST amplifier. A heater connected to the output of the differential amplifier alters the thermal operating point of both the MOST amplifier and the auxillary MOST amplifier until the source voltage of the auxillary MOST amplifier reverts to its original value.

6 Claims, 2 Drawing Figures

PATENTED DEC 31 1974 3,858,120

Figure 1:
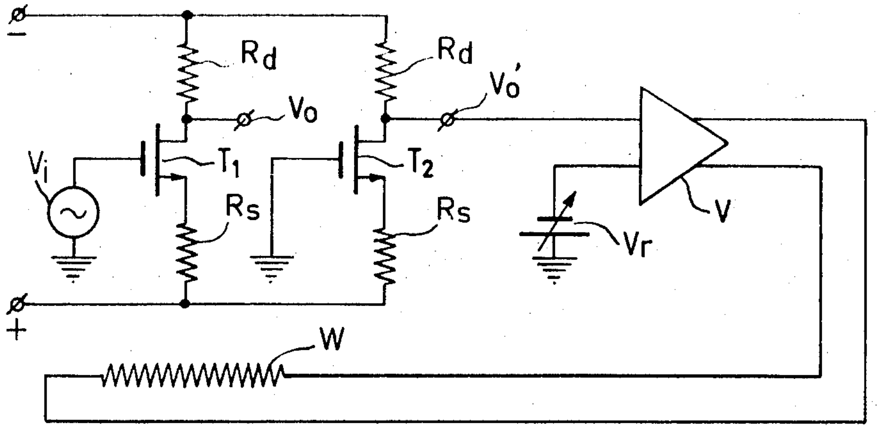

INVENTOR.
JEAN H.J. LORTEIJE
BY
[signature]
AGENT

INTEGRATED SEMICONDUCTOR DEVICE OR ELEMENT

This is a continuation of application Ser. No. 147,312, filed Apr. 22, 1971, now abandoned, and of application Ser. No. 834,956, filed June 20, 1969, now abandoned.

The invention relates to an integrated semiconductor device comprising a plurality of isolated-gate field-effect transistors provided on a semiconductor body.

In the literature, such field effect transistors are known inter alia under the designations MOST metal-oxide-semiconductor transistor), MNST (metal-nitride-semiconductor transistor) and MIST (metal-insulator-semiconductor transistor).

It has been found that such field-effect transistors are not only sensitive to temperature variations but also exhibit variations of the operation point which are due to variations in the behaviour of the insulating layer. These variations are of a slow nature, but they may be very considerable. Thus, under constant operating conditions, such as temperature, supply voltage and gate voltage, the bias current of the said field-effect transistors may vary by a factor of 3 in the course of say, one hour. This phenomenon would appear to be due to the fact that when the gate voltage is applied, a gradual shifting takes in the ion distribution of the oxide film or other insulating layer, with the result that the electric field strength in the area of the "channel" between the source and the drain varies in spite of the constant gate voltage.

It is an object of the present invention to obviate this troublesome variation of the set point and the invention is characterized in that in order to stabilize the operating point of at least one of the field effect transistors one of the remaining field effect transistors in which the dimensions of the parts essential to transistor action have been made equal to those of the first-mentioned transistor, is operated under the same bias current conditions at the same gate direct voltage and with the inclusion of equal resistances in the drain circuits or — if present — in the source circuits, the current flowing through the other field-effect transistor being supplied — if desired after amplification — to a heating component for the semiconductor body so as to cause the temperature of the said transistors to vary in a sense such that variations of this current due to variations which occur in the insulating layer of the gate of the other transistors are counteracted.

The invention is based on the recognition that when a plurality of equal field-effect transistors are integrated on a substrate the variations which occur in the behaviour of the insulating layer owing to the application of the gate voltages, are roughly equal for the various field-effect transistors. According to the invention, varying the temperature of the semiconductor body in a manner such that the bias current through the first-mentioned field-effect transistor is stabilized ensures that the bias current for the other field-effect transistors which are operated under the same conditions i.e. at the same gate direct voltage and with equal resistances in the drain circuits and, as the case may be, in the source circuits, are also stabilized.

It should be noted that in bipolar (*npn* and *pnp*) transistors it is known to integrate such a transistor on a semiconductor body, which transistor exhibits a current conductivity dependent on the temperature of the semiconductor body, the current of this transistor being supplied to a heating coil in a manner such that the said temperature variations are counter-acted. The combination of this transistor and of the heating coil then acts as a thermostat, irrespective of the bias-current conditions under which the transistor is operated, provided that the suppression of temperature variations is sufficient. In contradistinction thereto, in the device according to the invention temperature variations are intentionally introduced, whilst furthermore the bias-current conditions and the dimensions of the parts of the respective field-effect transistors which are responsible for the transistor action must be the same.

Figure 2:
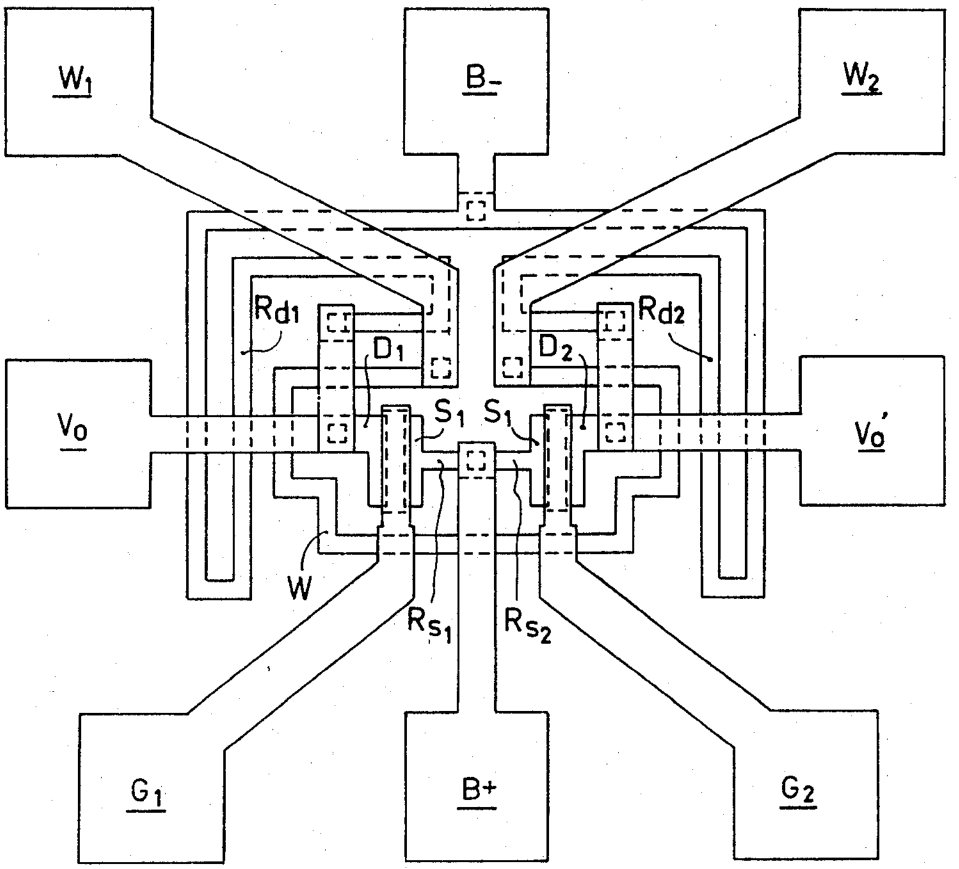

Features and advantages of the invention will appear from the following description of an embodiment thereof, given by way of example, only, with reference to the accompanying drawing, in which:

FIG. 1 is a circuit diagram of a semiconductor device according to the invention, and FIG. 2 shows the geometry of an integrated semiconductor element according to the invention.

FIG. 1 shows a first isolated-gate field-effect transistor $T_1$ to the gate of which an input signal $V_i$ is applied whilst the source is connected through a resistor $R_s$ to one terminal of a supply source and the drain is connected through a resistor $R_d$ to the other terminal of this supply source. An amplified output signal $V_o$ will then appear at the drain and may be applied to further stages (not shown) to accomplish a desired effect.

The transistor $T_1$ is integrated together with a plurality of similarly designed transistors on a semiconductor device by means of one of the usual integration techniques. One of these further transistors is the transistor $T_2$ in FIG. 1 to the gate of which is applied the same direct voltage as to the gate of the transistor $T_1$ whilst furthermore in the source and drain circuits resistors $R_s$ and $R_d$ respectively have been included which have the same values as those connected in the corresponding circuits of the transistor $T_1$.

The output direct voltage $V_o'$ of the transistor $T_2$ is applied to a heating element W, as the case may be through an amplifier V which may be integrated on the same semiconductor body as the transistors $T_1$ and $T_2$ and need not necessarily comprise field-effect transistors, but may if desired be provided with bipolar transistors. The heating element W may, for example, be a resistor which is either provided on the semiconductor body or integrated therein and encloses the transistors $T_1$ and $T_2$ so that the transistors $T_1$ and $T_2$ are as far as possible at the same temperature. If, for example, the amplifier V is designed as an operational amplifier, the voltage $V_o'$ is compared with a reference voltage $V_r$ which is as independent as possible of variations of the supply voltage and/or the temperature.

When the various direct voltages are applied, the current passed by the transistor $T_2$ proves to be sensitive inter alia to the value of these direct voltages and to adjust itself to a given value only after some time. This sensitivity is to be ascribed to changes in the behaviour of the insulating layer of the field-effect transistors. The resulting variations of the voltage $V_o'$ give rise to such a variation of the current through the heating element W that the temperature varies in a sense such that the current through the drain resistor $R_d$ of the transistor $T_2$ and hence the voltage $V_o'$ are stabilized. Since the insulating layer of the transistor $T_1$ exhibits a similar behaviour for these applied voltages, the said temperature adjustment will result in the bias current of the transistor $T_1$ being likewise stabilized.

FIG. 1 shows that a situation is concerned in which the direct voltage set up at the gates of the transistors $T_1$ and $T_2$ is equal to earth potential, whilst the source is connected to a positive terminal and the drain to a negative terminal of the supply source. However, if desired, one of these terminals of the supply source may be connected to earth and the direct voltage to be applied to the gate may be derived from the supply voltage by means of a voltage divider.

FIG. 2 shows the configuration of an integrated semiconductor device according to the invention. The gate lead of the transistor $T_1$ is designated by $G_1$. The metal layer connected to this lead controls the channel in the semiconductor body between the gate region $S_1$ and the drain region $D_1$ and is separated from this channel by means of an insulating, layer, preferably an oxide or nitride layer. Resistors $R_{s1}$ and $R_{d1}$ embedded in the semiconductor body correspond to the resistor $R_s$ and $R_d$, respectively, of the transistor $T_1$ of FIG. 1. The metal leads B+ and B− connected to these resistors must be connected each to one terminal of the supply source; the output signal is taken from the lead $V_o$.

In FIG. 2, owing to the symmetrical structure of the device the transistor $T_2$ of FIG. 1 is entirely equal to the transistor $T_1$, i.e., the dimensions of the source and drain regions, ($S_2$ and $D_2$ respectively), the channel between these regions, the thickness of the insulating layer on this channel and the gate on this insulating layer have been made equal to those of the transistor $T_1$. Resistors $R_{s2}$ and $R_{d2}$ also have been made equal to the resistors $R_{s1}$ and $R_{d1}$, respectively. These steps are of advantage for carrying out the integration technique, whilst in order to achieve the above described effect is is essential for at least the dimensions of the parts essential to the transistor action, especially the channel and the insulating layer at the area of the channel, to be equal.

The resistors $R_{s2}$ and $R_{d2}$ are again similarly connected to the leads B+, B− and $V_0'$. The same direct voltage is applied to the gate leads $G_1$ and $G_2$ whilst the contact $V_0'$ must be connected to an amplifier (V in FIG. 1) which is not shown in FIG. 2 and the output of which must be connected to contacts $W_1$ and $W_2$. These contacts $W_1$ and $W_2$ lead to a resistor W which is embedded in the semiconductor body and encloses the transistors $S_1$ - $D_1$ and $S_2$ - $D_2$ as closely as possible so as to ensure optimum temperature equality for these transistors.

Obviously a large number of transistors may be arranged on the semiconductor body within the resistor W, and their parts essential to the transistor action will then again be given equal dimensions. By including the resistors $R_d$ in the drain circuits outside the area enclosed by the resistor W, the heat dissipated in these resistors is prevented from adversely affecting the temperature equality of the field-effect transistors disposed within the area enclosed by the resistor W. If required, the resistors $R_s$ included in the source circuits may be similarly disposed.

What is claimed is:

1. An integrated circuit, comprising: an insulated-gate field-effect transistor; a biasing circuit tending to bias said transistor at a nominal operating point, the operating point tending to vary however even in a thermally static environment with static bias conditions due to changes in the electrical behavior of the insulating layer in said transistor; a heating element for maintaining said transistor in an elevated thermal environment; means for providing a measure of the amount by which the operating point of said transister deviates from said nominal operating point; and means controlling said heating element in accordance with said measure for changing the thermal environment of said transistor in the direction which tends to bring the operating point back toward said nominal operating point, thereby compensating for changes in the electrical behavior of the insulating layer by suitably changing the thermal environment of said transistor.

2. An integrated circuit as defined in claim 1 wherein said means for providing a measure comprises: an additional insulated-gate field-effect transistor including additional biasing circuitry therefor, both transistors being substantially identical and in the same thermal environment and both transistors being substantially identically biased, whereby both transistors are always at substantially the same operating point; means sensing a voltage which is a measure of the operating point of said additional transistor; and a reference voltage, the difference between said sensed voltage and said reference voltage providing a measure of the amount by which the operating point of said transistor deviates from said nominal operating point.

3. An integrated circuit as defined in claim 2 wherein said heating element is a resistor substantially enclosing both of said transistors.

4. An integrated circuit as defined in claim 3 wherein said means controlling said heating element is a differential amplifier responsive to said means sensing a voltage and said reference voltage for driving said resistor in accordance with the difference thereof.

5. An integrated circuit as defined in claim 4 wherein said biasing circuit and said additional biasing circuitry have an equal drain resistance, said drain resistances being not enclosed by said resistor substantially enclosing both of said transistors.

6. An integrated circuit as defined in claim 5 wherein said means sensing a voltage is a conductor electrically connected to the drain contact of said additional transistor.

* * * * *